United States Patent [19]

Bobeck

[11] 4,094,002
[45] June 6, 1978

[54] SACRIFICIAL ARC SUPPRESSORS IN MAGNETIC BUBBLE MEMORIES

[75] Inventor: Andrew Henry Bobeck, Chatham, N.J.

[73] Assignee: Bell Telephone Laboratories, Incorporated, Murray Hill, N.J.

[21] Appl. No.: 779,839

[22] Filed: Mar. 21, 1977

[51] Int. Cl.² .............................................. G11C 19/08
[52] U.S. Cl. ......................................... 365/1; 365/7; 365/12; 365/15; 365/36
[58] Field of Search ................. 340/174 TF; 361/139, 361/220; 357/23, 51; 29/584, 585, 586; 365/1

[56] References Cited

U.S. PATENT DOCUMENTS 3,676,742  7/1972  Russel et al. ............................ 357/23
3,820,092  6/1974  Bobeck et al. ................. 340/174 TF Primary Examiner—James W. Moffitt
Attorney, Agent, or Firm—Herbert M. Shapiro

[57] ABSTRACT

Magnetic bubble memory chips herein are characterized by circuits of permalloy and/or electrical conductors which include patterns designed to be sacrificed if electrical charges build up during processing or handling. Improved chip yield results.

7 Claims, 2 Drawing Figures

SACRIFICIAL ARC SUPPRESSORS IN MAGNETIC BUBBLE MEMORIES

FIELD OF THE INVENTION

This invention relates to magnetic bubble memories, and more particularly to such a memory which includes patterns of permalloy and electrical conductors which control the operation of the memory.

BACKGROUND OF THE INVENTION

Magnetic bubble memories characterized by permalloy elements which respond to a magnetic field rotating in the plane of bubble movement are commonly referred to as "field-access" bubble memories because data in the memory is responsive to the rotating field for movement to a readout position. In the usual organization, the memory includes a plurality of recirculating loops for permanent storage of bubble patterns (data) and an accessing loop or channel in which the readout and write positions are located. Organizations of this type are commonly referred to as "major-minor" organizations as is well known.

Although the movement of the bubble patterns in such a memory is controlled by the pattern of permalloy elements insofar as movement along a loop or channel is concerned, movement between loops or channels is controlled by the electrical conductor pattern. For example, a bubble pattern can be transferred from the minor loops (in parallel) to the major loops. In this instance, the rotating field causes the pattern first to move through the readout position, where detection occurs, and second, to return to the transferee positions for transfer back to the originating positions in the minor loops. The numbers of stages in the various loops are chosen so that the vacancies created upon the initial transfer of data are positioned to receive that data when the transfer-back operation occurs.

Alternatively, data may be replicated from the minor loops into the major loop without need to return the data to the minor loops. In this instance, the major path need not be a loop as is well known. But whether data transfer or replication occurs, a pattern of electrical conductors is employed to couple the layer of bubble movement where the minor loops and the major path come into close proximity.

Electrical conductor patterns are also employed where readout and write operations are defined. This is important for selective control of data retrieval and storage, respectively. Thus, both permalloy patterns and electrical patterns are used for field-access bubble memories.

Because data is represented by such a small entity, as a magnetic bubble, in a memory of this type, a bubble is expanded laterally with respect to the axis of movement of bubbles in the major path in order to achieve adequate output signal levels. The mechanism of bubble movement, to this end, involves the use of increasing numbers of permalloy elements in a progression of stages leading up to a magnetoresistive detector--an arrangement commonly referred to as an expander detector. In this type of detector, large numbers of permalloy elements are closely packed and an electrical conductor (in practice, also made of permalloy) couples all the elements of the detector stage which includes the largest number of elements.

Encompassing the active field-access circuit of the typical bubble memory is a dynamic "guardrail." The guardrail also includes closely packed permalloy elements operative in response to the rotating field to move spurious bubbles away from the active circuit. Typically, the expansion detector is integrated into the guardrail providing an overall geometry characteristic of a field-access bubble memory and easily recognized by inspection through a microscope. An integrated expander detector and guardrail for a magnetic bubble memory is disclosed in U.S. Pat. No. 3,713,117 of A. H. Bobeck issued Jan. 23, 1973.

It has been noticed that an occasion permalloy elements have been found missing from completely processed bubble memory chips. More frequently, portions of elements have been found missing or elements appear damaged in some way. This damage has been attributed to electrostatic charges built up during ion implanting or during ion milling operations which are utilized in manufacturing bubble memories for hard bubble suppression and for the formation of the permalloy elements, respectively, as is well known. Moreover, similar charges are generated due to handling of the wafers of garnet on which the memory chips are defined. Even the charges due to human handling can build up to thousands of volts, far more than necessary to account for missing or damaged elements.

The build up of charge during processing occurs when a uniform layer of permalloy covering a number of chips is formed on a (two inch) garnet wafer. The periphery of the wafer is held at ground potential by the holder which supports it. When discrete permalloy patterns begin to be formed by ion milling of the permalloy layer, the charge build-up is initiated.

BRIEF DESCRIPTION OF THE INVENTION

The invention is directed at a magnetic bubble memory including memory-defining patterns of permalloy and electric conductors and a preferred arcing position, preferably including an island, strategically placed to provide a preferred conducting path for the discharge of any electrostatic charge which might accumulate during processing or handling. Such an island is designed to have no function during operation of the device and therefore is, in fact, a sacrificial island. A sacrificial island is recognizable upon inspection of a memory chip through a microscope because it is not coupled to other permalloy paths in the memory by either permalloy elements or by an electrical conductor pattern for the movement of bubbles thereto--thus the designation "island."

In another embodiment, portions of the permalloy pattern may be closely spaced from portions of a conductor pattern therebeneath, but not in registry therewith. Such portions may have use during operation of the resulting chip. Nevertheless, the portions are enlarged to allow damage without harm to later (current-carrying) operation.

DETAILED DESCRIPTION

Figure 1:
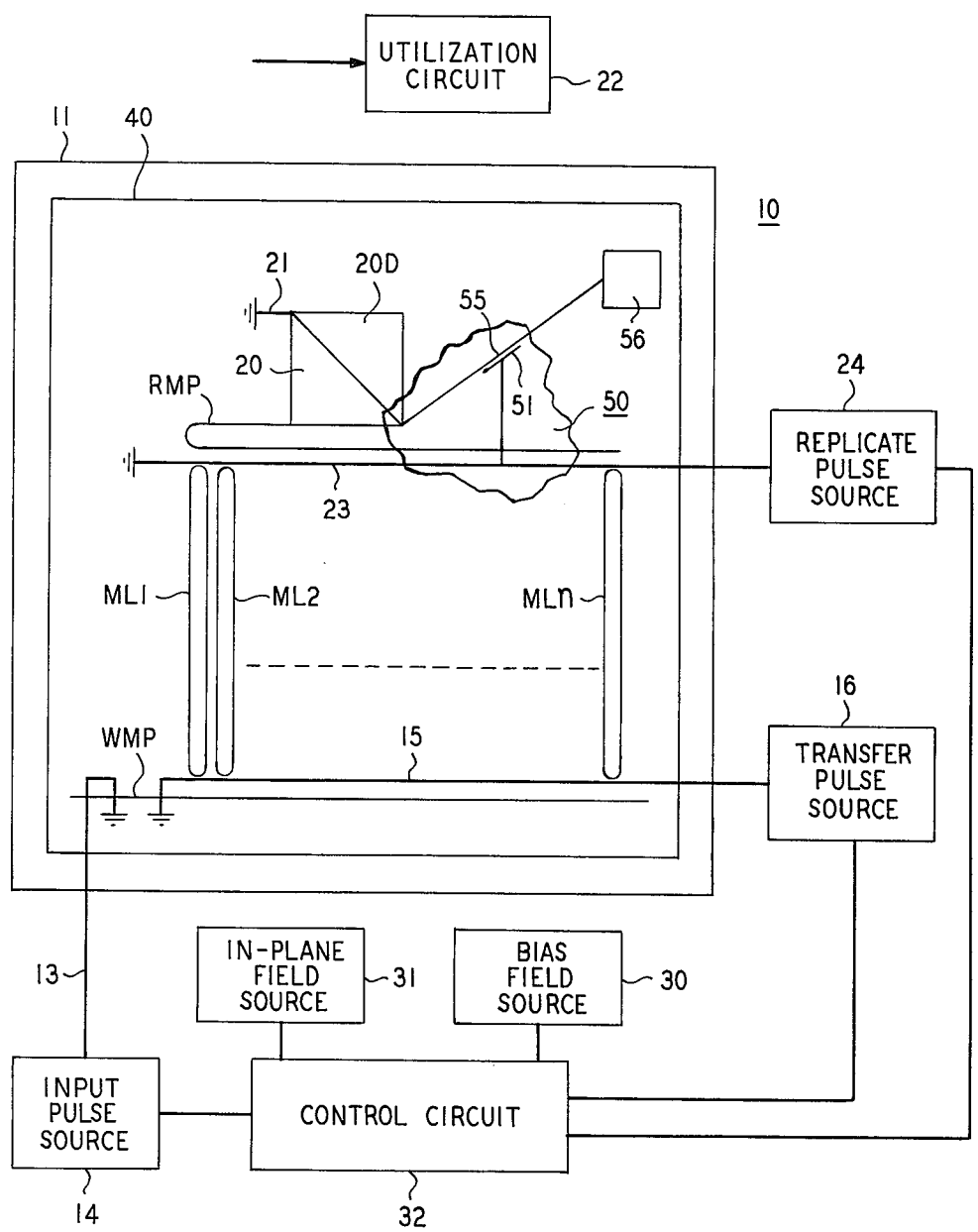
FIG. 1 is a schematic representation of a field-access magnetic bubble memory including a sacrificial island in accordance with this invention.

FIG. 1 shows a field-access magnetic bubble memory 10. The memory comprises a layer 11 of magnetic material in which magnetic bubbles can be moved. Layer 11 typically comprises a single crystal of nonmagnetic garnet material as a substrate on which an epitaxial magnetic garnet layer defines the actual layer of bubble movement. In practice, an ion implanted layer (not shown) is formed uniformly in the surface of layer 11. The ion implanted layer suppresses the formation of hard bubbles in the epitaxial film and thus is important even though it results in the accumulation of static charge as mentioned hereinbefore.

A pattern of permalloy elements forms minor loops and major paths in layer 11. These loops and paths are well known in the art and are thus represented only as lines in FIG. 1. The relevant patterns are shown enlarged and in detail in FIG. 2. Accordingly, minor loops $ML_1, \ldots ML_N$ are shown extending between write and read major paths WMP and RMP, respectively.

Write path WMP extends to the right, as viewed, from an input position coupled by conductor 13. Conductor 13 is connected between an input pulse source 14 and ground. A bubble-pattern transfer conductor 15 couples stages of the write path WMP to associated stages of the minor loops and is operative to move data from the path WMP into the minor loops for storage. Conductor 15 is connected between a transfer pulse source 16 and ground.

Read operations are carried out at the opposite ends of the minor loops. There, read major path RMP is closely spaced with respect to the minor loops. Path RMP extends to a triangular-shaped area 20 which represents the expander detector. A dummy detector 20D, for cancellation of in-plane field components, is also shown. Detector 20 actually comprises a conductor 21 connected between utilization circuit 22 and ground. Conductor 21 includes interlinked permalloy elements of a detector stage of detector 20 as is well known.

The read path RMP and the minor loops are separated by a replicate conductor 23 connected between a replicate pulse source 24 and ground. The overall operation of bubble memory organized with a swap function implemented at the write major path is disclosed in U.S. Pat. No. 4,007,453 of P. I. Bonyhard-Y. Chen-J. L. Smith, issued Feb. 8, 1977.

Bubble operation occurs over a stable range of operation determined, inter alia, by a bias field antiparallel to the preferred direction of magnetization of layer 11, typically normal to the plane of the layer. Block 30 represents a source of such a field. The source of the rotating in-plane field is represented by block 31. Overall activation and synchronization is controlled by a control circuit represented by block 32. The familiar guardrail is represented at 40.

The area of the memory of FIG. 1 most affected by arcing is in the vicinity of the detector conductor 21. The arcing normally occurs between the replicate conductor and the detector conductor. It is to be understood that both conductor and permalloy pattern levels are involved in the illustrative embodiment, the discharge being through the normal $SiO_2$ insulating layer separating the two levels. The normal processing of bubble memories involves the deposition of the conductor pattern, chemical etching to provide bevelled edges to the conductors, an $SiO_2$ coating and a final permalloy pattern formation involving ion milling. The discharge path follows the conductors, through cracks in the $SiO_2$ originating at the permalloy elements and causing damage thereto.

Figure 2:
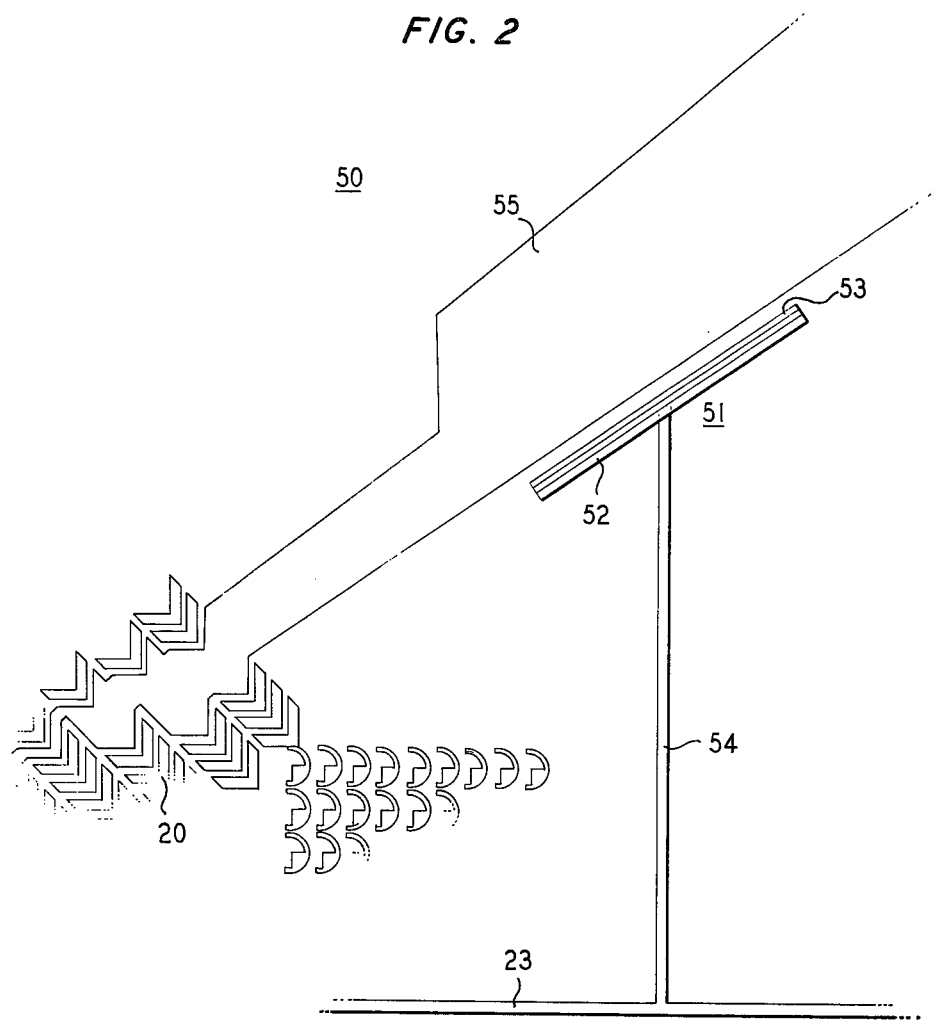
FIG. 2 is a schematic representation of a portion of the memory of FIG. 1 showing a sacrificial island and the placement thereof to avoid the common damages.

FIG. 2 shows a region 50 of FIG. 1 including a sacrificial island 51 for arc suppression. Island 51 comprises a permalloy rectangle 52 deposited typically at the same time the propagation elements are deposited. The permalloy rectangle is separated from the conductor level therebeneath by $SiO_2$ as mentioned hereinbefore. The conductor level includes a conductor rectangle 53. Thus, the permalloy 52 is deposited over a sloped step in the conductor level where the $SiO_2$ layer is relatively thin and cracks are likely to appear. Conductor area 53 is connected to replicate conductor 23 by a conductor link 54. A large permalloy area 55 is closely spaced apart from permalloy rectangle 53 which provides a path to metallic land 56 for external connection to conductor 21 of FIG. 1. The illustrative sacrificial island herein thus is formed in the permalloy level of the circuit and provides a preferred arcing position into the conductor level for accumulated charges that build up in the permalloy level of the circuit. These charges otherwise are discharged through a position formed by functionally necessary permalloy elements and frequently are destructive of those elements.

Frequently, a second expander detector and dummy arrangement is formed in a bubble memory chip design. This second arrangement also has associated with it a sacrificial island for arc suppression. Thus, a single bubble memory chip may have a plurality of sacrificial islands, the placement of which in each instance is dictated by the location of damaged elements in predecessor chips.

During processing of a bubble circuit, the permalloy pattern is formed from a uniform permalloy layer. Specifically, elements 52 and 55 begin to form. As soon as the elements separate from the uniform layer, they no longer are electrically connected to the wafer support and are thus no longer grounded. Charge begins to accumulate. At this juncture in the proccessing, elements 53 and 55 may still be connected by permalloy when electrical discharge occurs along a path comprising permalloy elements 55 and 52 and (subterranean) electrical conducting elements 54 and 53 through the oxide layer therebetween. Element 52 is damaged during discharge but in practice allows for a substantial improvement in yield of nominally 70,000 bit circuits of the type shown in FIG. 1.

In the absence of permalloy island 52, permalloy element 55 is closely spaced but offset with respect to conductor rectangle 53. The offset position is to avoid the possibility of short circuits between the elements because of the thin oxide which occurs where a permalloy level crosses a conductor level. Discharge, in the absence of island 52, also occurs at the preferential arcing position between elements 55 and 53 through the oxide level but at higher voltages at which alternative discharge paths through useful elements are more likely. Rectangle 53 can be appreciated to serve no cooperative function with element 55 in later operation of the memory.

What has been described is considered merely illustrative of the principles of this invention. Therefore, various modifications thereof may be devised by those skilled in the art in accordance with those principles within the spirit and scope of this invention as encompassed by the following claims.

What is claimed is:

1. A magnetic bubble memory including a layer of magnetic material in which magnetic bubbles can be moved, said memory also including a first pattern of magnetic elements for defining paths in said layer for moving bubble patterns therealong responsive to a cyclical magnetic field, a second pattern of electrical conductors coupled to said layer for controlling the movement of bubbles between said paths and for defining bubble generation and detection functions in said layer, said memory also including a sacrificial island for arc suppression.

2. A magnetic bubble memory including a layer of magnetic material in which magnetic bubbles can be moved, said memory also including a first pattern of a second magnetic material defining paths for bubble movement in said layer, said memory further including a second pattern of electrical conductors for controlling functional operations on the pattern of bubbles in said paths, said memory being characterized by a sacrificial island of said second magnetic material closely spaced apart from said second pattern, said island being closely associated with a portion of said second pattern for the purpose of providing a charge leakage path.

3. A magnetic bubble memory in accordance with claim 2 wherein said first pattern is separated from said second pattern by an insulating layer and said sacrificial island is formed simultaneously with the formation of said first pattern, said island being associated with a conductor geometry formed therebeneath as a part of said second pattern.

4. A magnetic bubble memory in accordance with claim 3 wherein said sacrificial island comprises permalloy and is closely spaced apart from said conductor geometry.

5. A magnetic bubble memory in accordance with claim 4 in which said conductor geometry is bevelled to form a sloped edge.

6. A magnetic bubble memory including a layer of magnetic material in which magnetic bubbles can be moved, said memory including a first pattern of permalloy elements said memory also including a second pattern of electrically conducting material, said first and second patterns being spaced apart by an insulating layer and being adapted to include first and second portions thereof respectively in close proximity with but offset with respect to one another, said second portion being operative to form a discharge path for charges in said first portion and otherwise serving no cooperative function with said first portion.

7. A magnetic bubble memory including a layer of magnetic material in which magnetic bubbles can be moved, said memory including first and second patterns of permalloy and electrically conducting materials separated by an insulating layer, said first and second patterns including portions thereof in close proximity and adapted to define a preferential arcing position therebetween.

* * * * *